United States Patent [19]

Mochizuki et al.

[11] 4,413,272
[45] Nov. 1, 1983

[54] SEMICONDUCTOR DEVICES HAVING FUSES

[75] Inventors: Hirohiko Mochizuki, Tokyo; Masao Nakano, Kawasaki; Fumio Baba, Yokohama; Tomio Nakano, Kawasaki; Yoshihiro Takemae, Yokohama, all of Japan

[73] Assignee: Fujitsu Limited, Kawasaki, Japan

[21] Appl. No.: 183,734

[22] Filed: Sep. 3, 1980

[30] Foreign Application Priority Data

Sep. 5, 1979 [JP] Japan .................. 54-122908[U]

[51] Int. Cl.³ .................. H01L 23/52; G11C 17/00
[52] U.S. Cl. .................. 357/65; 357/45; 357/51; 357/54; 357/71
[58] Field of Search .................. 357/65, 68, 71, 51, 357/40, 45, 54

[56] References Cited

U.S. PATENT DOCUMENTS 3,564,354  2/1971  Aoki et al. .................. 357/48
3,792,319  2/1974  Tsang .................. 357/68

OTHER PUBLICATIONS

Deliduka et al., IBM TDB vol. 19, No. 4, Sep. 1976, p. 1161.

Primary Examiner—William D. Larkins
Attorney, Agent, or Firm—Staas & Halsey

[57] ABSTRACT

A semiconductor memory device has fuses coated with a protecting layer. The protecting layer is selectively etched to open windows so as to expose narrow center portions of the fuses. After the opening of the center windows, the fusing operation of the fuses is carried out to open a gap in the center window portion of the fuse material. In a preferred embodiment, another protective layer is then added to fill the gaps in the blown fuses.

18 Claims, 4 Drawing Figures

SEMICONDUCTOR DEVICES HAVING FUSES

BACKGROUND OF THE INVENTION

1. Field of the Invention

The present invention relates to semiconductor devices having fuses and, more particularly, to memory devices having spare (i.e. redundant) memory cells, and fuse-link programmable read-only memory (PROM) devices.

2. Description of the Prior Art

A semiconductor memory is organized as a matrix of horizontal or row lines and vertical or column lines. At each intersection of the matrix a memory cdll is provided which is able to store one bit of information. If at least one defect, e.g. a defective memory cell, occurs in a memory device, the device should be abandoned. However, if the number of the defects is small, the bad memory device can be changed into a good memory device by using a redundancy technique. It is possible to remarkably increase the production yield by providing redundant (i.e. spare) row and column lines in the memory device. The spare row lines and spare column lines which form spare memory cells are built into the memory device while it is being produced. When, for example, a row line of a defective memory cell (i.e. a defective bit) is found during testing, the defective row line is eliminated and a spare row line is substituted in its place. Namely, the defective row line is cut off from the regular row decoder thereof and, simultaneously, the spare row decoder of the spare row line is formed to respond to the same address as that of the defective row line to be replaced. Thus, the spare row decoder behaves exactly like the regular row decoder. The above-mentioned cutting off of the defective row line and formation of the spare row decoder can be carried out by blowing fuses provided between the regular row decoder and the defective row line and within the spare row decoder. Similarly, a defective column line can be eliminated and a spare column line can be substituted in its place. Generally, fuses are formed in every row line, every column line, every spare row decoder and every spare column decoder of a semiconductor memory device.

There is a well-known fuse-link-programmable read-only memory (PROM) device provided with fuses in every bit (i.e. memory cell). In order to write information, a fuse in a bit is blown by passing excess current (i.e. fusing current) between a row line and a column line of the bit.

A fuse element compriting both the above-mentioned fuses of the semiconductor memory device which has redundant memory cells and the fuses of the fuse-link PROM has a structure as illustrated in FIG. 1. The fuse element 1 of FIG. 1 is produced in the following manner. The starting material is a semiconductor substrate (e.g. silicon wafer) 2. An isolating layer (e.g. silicon dioxide layer) 3 is formed on the semiconductor substrate 2 by chemical vapor deposition or thermal oxidation of silicon. Fuse material, e.g. polysilicon, nichrome (Ni-Cr), titanium-tungsten (Ti-W) or platinum silicide (PtSi), is deposited on the isolating layer 3 by vapor deposition or sputtering and, then, is patterned by photoetching to form a fuse 4 having a so-called bow-tie shape which consists of two relatively large rectangular portions and a belt shaped portion connecting the two rectangular portions. An insulating layer 5 of silicon dioxide ($SiO_2$), silicon nitride ($SiN_4$) or phospho-silicate glass (PSG) is formed on the fuse 4 and the isolating layer 3 by chemical vapor deposition and, then, is selectively etched to open two windows for electrical contact on the fuse 4 by photoetching. Then, a conductor material (e.g. aluminum) is formed by vapor deposition and is selectively photo etched to form predetermined conductor lines 6. A protective layer 7 of silicon dioxide, silicon nitride or phospho-silicate glass is formed on the conductor lines 6 and the insulating layer 5.

Fusing of the fuse 4 is performed by passing a fusing current through the fuse 4 via the conductor lines 6. The fusing current is limited to a value of current which is allowed to pass through a metal oxide semiconductor (MOS) transistor or a bipolar transistor in a memory device. However, it is possible that a fuse can not be blown by passing this level of fusing current and/or that a small bridge is formed between separated portions of the blown fuse, and therefore, fuse-reliability is low.

SUMMARY OF THE INVENTION

An object of the present invention is to increase the fuse-reliability.

Another object of the present invention is to provide improved fuses which will blow easily and surely by applying a fusing current.

A further object of the present invention is to provide a semiconductor device having the above-mentioned improved fuses.

These and other objects of the present invention are achieved by improving a conventional semiconductor device having fuses coated with a protective layer by exposing a portion of the fuse by opening a window in the protective layer.

DETAILED DESCRIPTION OF THE PREFERRED EMBODIMENTS

Figure 1:
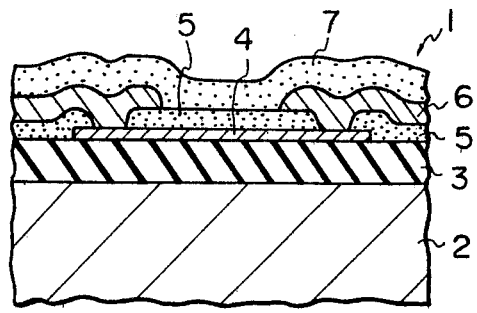
FIG. 1 is a schematic, cross-sectional view of a conventional fuse element of a semiconductur device.
Figure 2:
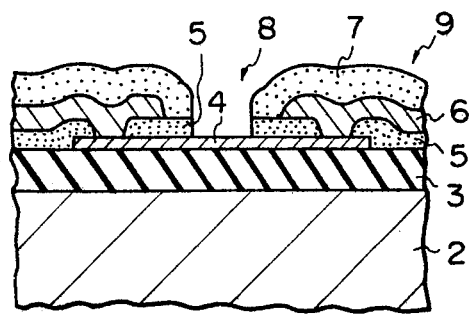
FIG. 2 is a schematic, cross-sectional view of an improved fuse element according to the present invention.
Figure 3:
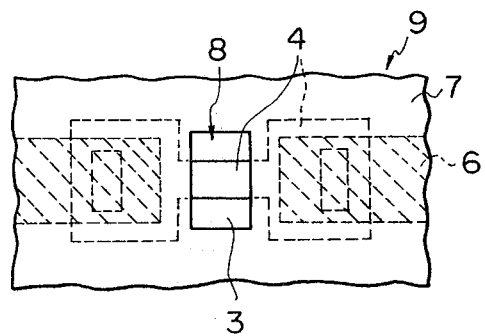
FIG. 3 is a plan view of the improved fuse element of FIG. 2.

Illustrated in FIGS. 2 and 3 is a fuse element 9 in accordance with the present invention. Reference numerals 2 through 7 in FIGS. 2 and 3 represent the same parts as those represented by the reference numerals 2 through 7 in FIG. 1. After formation of the protective layer 7, a window 8 is opened by pohtoetching to expose a narrow center portion of the fuse 4, as illustrated in FIGS. 2 and 3. The fuse 4 has a bow-tie shape as illustrated in FIG. 3, so that the narrow center portion exposed within the window 8 of the fuse 4 can be easily and surely blown by passing a fusing current through the fuse 4. It has been found that the gap between separated portions of a blow fuse 4 is wider than that between separated portions of a blown fuse which is completely coated with a protective layer. According to the present invention, the narrow center portion of each blown and unblown fuse in a semiconductor device is exposed by a window formed in the protecting layer 7.

Figure 4:
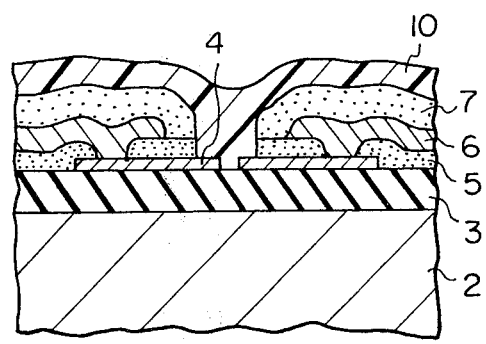
FIG. 4 is a schematic, cross-sectional view of the improved fuse element with an additional protecting layer.

It is preferable to form an additional protective layer 10 of phosphosilicate glass, silicon nitride or polyimide subsequent to the fusing operation, so as to plug up the window 8, as illustrated in FIG. 4. Thus, the blown fuses and unblown fuses in the semiconductor device are coated with the additional protective layer 10.

EXAMPLE

Bow-tie shaped fuses of polysilicon were formed by chemical vapor deposition on a silicon dioxide ($SiO_2$) layer which was formed by thermally oxidizing a silicon single crystalline substrate. Each of the fuses had a thickness of 0.3 microns. A narrow center portion of the fuse had a width of 2.5 microns and a length of 7 microns. After formation of a protective layer of phosphosilicate glass on the fuses, rectangular windows of 5 microns by 10 microns were formed in the protecting layer on the narrow center portions of the fuses by photoetching. The fuses were blown by passing a fusing current through the fuses. The peak value of the fusing current was in the range of from 50 to 60 milliamperes. As a comparative example the above-mentioned polysilicon covered fuses were blown by passing a fusing current prior to the opening of the windows. In this case the peak value of the fusing current was in the range of from 70 to 80 milliamperes. Furthermore, fused gaps between separated portions of the fuses with windows were wider than those of separated portions of the fuses without windows.

It will be obvious that the present invention is not restricted to the above-mentioned embodiments and example, and that many variations are possible for those skilled in the art without departing from the spirit and scope of the invention.

We claim:

1. A semiconductor device having a fuse comprising:
   a semiconductor substrate;
   an isolating layer formed on said semiconductor substrate;
   fuse material formed on said isolating layer in a predetermined pattern;
   an insulating layer formed over said fuse material and over said isolating layer and shaped so as to provide windows over end portions of said fuse material;
   conductor material deposited in a predetermined shape over said insulating layer and through said windows to contact said fusing material; and
   a protective layer formed over said conductor material and said insulating layer, and shaped so as to provide a window to the middle portion of said fuse material,
   an additional protective layer covering at least said window to the middle portion of said fuse material, and formed after said fuse material has a gap formed therein.

2. The semiconductor device of claim 1, wherein the gap is formed in the middle portion of said fuse material and said additional protective layer is formed so as to fill the gap.

3. The semiconductor device of claim 2, wherein said additional protective layer is formed so as to cover said conducting material, said fuse material, said insulating layer, and said protective layer.

4. The semiconductor device of claim 1, wherein said fuse material is formed into a bowtie shape of two relatively large end portions and a relatively narrow belt-shaped connecting portion.

5. The semiconductor device of claim 1, wherein said protective layer is made of phosphosilicate glass.

6. The semiconductor device of claim 2, wherein said additional protective layer is made of material selected from the group consisting of silicon nitride, phosphosilicate glass and polyimide.

7. The semiconductor device of claim 1, wherein the fuse material has a gap formed therein by imparting a fuse current to said fuse material and wherein the peak value of fusing current used to create the gap in said fuse material is in the range of 50 to 60 milliamperes.

8. A semiconductor device according to claim 1, wherein said device is a semiconductor memory device.

9. A semiconductor device according to claim 1, wherein the semiconductor device has a plurality of fuses each having a bow-tie shape of two relatively large end portions and a relatively narrow belt-shaped connecting portion.

10. A semiconductor device according to claim 1, wherein said protective layer is made of material selected from the group consisting of silicon dioxide, silicon nitride and phosphosilicate glass.

11. A semiconductor device according to claim 1, wherein said additional protective layer is made of material selected from the group consisting of silicon nitride, phosphosilicate glass and polyimide.

12. A semiconductor memory device having a plurality of bits and fuse elements for said bits, comprising:
    (a) a semiconductor substrate;
    (b) an isolating layer formed on said semiconductor substrate;
    (c) fuse material formed on said isolating layer in a predetermined shape;
    (d) an insulating layer formed over said fusing material and over said isolating layer and shaped so as to provide windows over the ends of said fuse material;
    (e) conductor material deposited in a predetermined shape over said insulating layer and through said windows to contact said fusing material;
    (f) a protective layer formed over said conductor material and over said insulating layer, and shaped so as to provide a window to the middle portion of said fuse material; and
    (g) an additional protective layer covering at least said window to the middle portion of said fuse material, and formed after said fuse material has a gap formed therein.

13. The device of claim 12, wherein the gap is formed in the middle portion of said fuse material and said additional protective layer formed so as to fill the gap.

14. The device of claim 13, wherein said additional protective layer covers said conducting material, said fuse material, said insulating layer and said protective layer.

15. The device of claim 12, wherein said fusing material is formed in a bowtie shape of two relatively large end portions and a relatively narrow belt-shaped connecting portion.

16. The device of claim 12, wherein said protective layer is made of material selected from the group consisting of silicon dioxide, silicon nitride and phosphosilicate glass.

17. The device of claim 13, wherein said additional protective layer is made of material selected from the group consisting of silicon nitride, phosphosilicate glass and polyimide.

18. The device of claim 12, wherein the fuse material has a gap formed therein by imparting a fuse current to said fuse material and wherein the peak value of the fusing current used to create said gap in said fuse material is in the range of from 50 to 60 milliamperes.

* * * * *

UNITED STATES PATENT AND TRADEMARK OFFICE
CERTIFICATE OF CORRECTION

PATENT NO. : 4,413,272
DATED : November 1, 1983
INVENTOR(S) : MOCHIZUKI et al.

It is certified that error appears in the above-identified patent and that said Letters Patent is hereby corrected as shown below:

Column 1, line 14, "cdll" should be --cell--;
        line 51, "compriting" should be --comprising--.

Signed and Sealed this

Second Day of October 1984

[SEAL]

Attest:

GERALD J. MOSSINGHOFF

Attesting Officer      Commissioner of Patents and Trademarks